United States Patent [19]

Shimanuki et al.

[11] Patent Number: 4,896,103
[45] Date of Patent: Jan. 23, 1990

[54] CURRENT MEASURING MAGNETIC FIELD SENSOR HAVING MAGNETOOPTIC ELEMENT WITH ITS EASY AXIS OF MAGNETIZATION AT RIGHT ANGLES TO THE MAGNETIC FIELD GENERATED BY THE CURRENT

[75] Inventors: Senji Shimanuki, Atsugi; Susumu Hashimoto, Tokyo; Shunji Nomura, Yokohama; Tomohisa Yamashita, Kawasaki, all of Japan

[73] Assignee: Kabushiki Kaisha Toshiba, Kawasaki, Japan

[21] Appl. No.: 183,302

[22] Filed: Apr. 11, 1988

Related U.S. Application Data

[63] Continuation of Ser. No. 878,796, Jun. 26, 1986, abandoned.

[30] Foreign Application Priority Data

Jun. 29, 1985 [JP] Japan .................. 60-143732
Jul. 31, 1985 [JP] Japan .................. 60-168944
Nov. 27, 1985 [JP] Japan .................. 60-266948

[51] Int. Cl.$^4$ .................. G01R 33/032; G01R 19/00; G02F 1/09
[52] U.S. Cl. .................. 324/96; 324/244; 350/376
[58] Field of Search .................. 324/96, 244, 260; 350/374–378; 356/350; 250/227, 231 R

[56] References Cited

U.S. PATENT DOCUMENTS

| 3,245,314 | 4/1966 | Dillon .................. 350/378 X |
| 3,316,050 | 4/1967 | Ferguson et al. .................. 350/378 |
| 3,527,577 | 9/1970 | Fan et al. .................. 350/376 X |
| 4,225,239 | 9/1980 | Prinz .................. 356/350 |
| 4,604,577 | 8/1986 | Matsumura et al. .................. 324/244 |

FOREIGN PATENT DOCUMENTS

| 168622 | 12/1981 | Japan .................. 350/375 |
| 57-37277 | 3/1982 | Japan . |
| 58-27071 | 2/1983 | Japan . |
| 58-27072 | 2/1983 | Japan . |
| 58-139082 | 8/1983 | Japan . |

OTHER PUBLICATIONS

Doriath et al, A Sensitive and Compact Magnetometer Using Faraday Effect in YIG Waveguide, J. Appl. Phys., vol. 53, No. 11, Nov. 1982, pp. 8263–8265.
*Mastushita Techno Report*, vol. 29, No. 5, Oct. 1983, pp. 70–80.
*Keiso*, vol. 26, No. 11, Oct. 1983, pp. 56–60.

Primary Examiner—Gerard R. Strecker
Attorney, Agent, or Firm—Oblon, Spivak, McClelland, Maier & Neustadt

[57] ABSTRACT

The magnetic field sensor is described for sensing the magnetic field, which comprises a light source part, a magnetic field detection part which contains a magnetooptic element consisting of a magnetic materials having a magnetooptic effect, and a light measurement part which measures the light that has been radiated from the light source part and has passed through the magnetic field detection part, is characterized in that the magnetooptic element is arranged such that its easy axis of magnetization is at substantially right angles to the direction of the magnetic field to be measured. The sensor can measure in a wide range of magnetic field with a high degree of accuracy and high sensitivity.

24 Claims, 9 Drawing Sheets

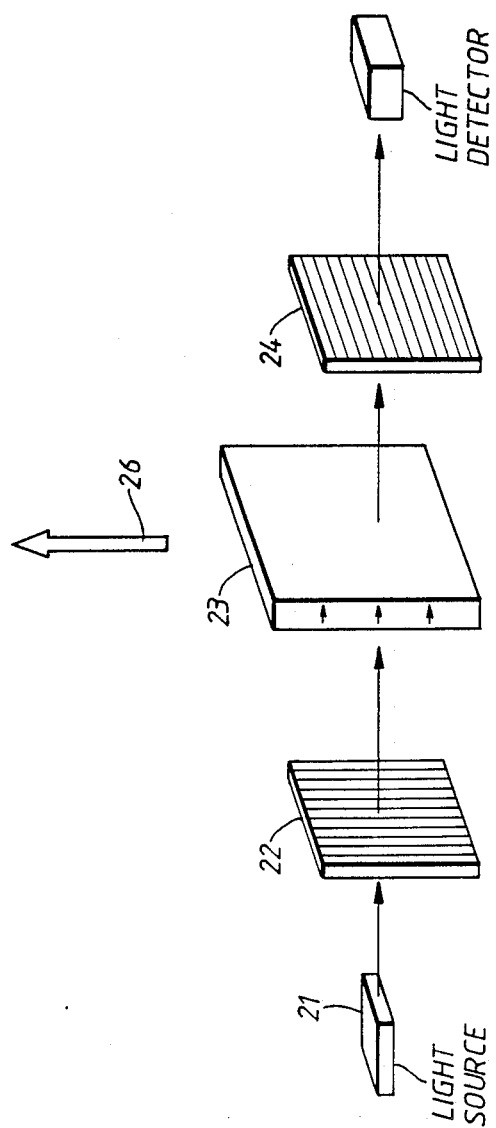

CURRENT MEASURING MAGNETIC FIELD SENSOR HAVING MAGNETOOPTIC ELEMENT WITH ITS EASY AXIS OF MAGNETIZATION AT RIGHT ANGLES TO THE MAGNETIC FIELD GENERATED BY THE CURRENT

This application is a continuation of application Ser. No. 878,796, filed June 26, 1986.

BACKGROUND OF THE INVENTION

1. Field of the Invention

The invention relates to a magnetic field sensor which uses the magnetooptic effect of magnetic materials. In particular, it provides a magnetic field sensor which can measure a wide range of magnetic fields with a high degree of accuracy.

2. Discussion of Background

In the field of power electronics, the efficient running and automation of electric power systems of increasing capacity necessitates digital control and protection systems for the high voltage plant in substations and the like. Current and voltage sensors for controlling and measuring the current and voltage of high-voltage power transmitters and transformers are indispensable for this purpose. A need exists for the equipment to be small, low in cost and reliable. Current and voltage sensors must be well insulated against high voltages, resistant to electromagnetic faults, miniaturized, and of high performance.

Prior art systems for the control and measurement of current was effected by using a large, wound-type transformer, with a core and windings, to transform the magnetic field produced by the electric current into a current and voltage. However, the windings and core used in these transformers took up a lot of space, and there were problems related with poor insulation against high voltages and poor resistance to electromagnetic noises.

In order to solve the problems associated with the transformers described above, the optical magnetic field sensor has been developed as current sensing devices for electrical systems. In recent years, magnetic garnet single crystal and ZnSe single crystal having a large magnetooptic effect (Faraday Effect) and a little optical absorption have been disclose in reports of optical magnetic field sensors which use these in combination with optical fibers (e.g. *National Technical Report,* Vol. 29, No. 5, October 1983, pp. 70–80; *Keiso,* Vol. 26, No. 11, October 1983, pp. 56–60 and Japanese Patent Disclosure No. 58-139082).

These optical magnetic field sensors consist of a light source part (e.g. a light-emitting diode), a magnetic field detection part, containing magnetic garnet single crystal having a Faraday effect (e.g. $(Y.Tb)_3Fe_5O_{12}$, $(Y.Sm.Lu.Ca)_3(Fe.Ge)_5O_{12}$, $[Y_{0.3}Sm_{0.5}Lu_{1.4}Ca_{0.6}Gd_{0.2}](Fe_{4.4}Ge_{0.6})O_{12}$) a polarizer, a light-measuring part which receives and measures the light which is radiated from the light source part and passes through the magnetic field detection part, and an optical transmission line which links by optical means the light source part, magnetic field detection part and light-measuring part.

As shown in FIG. 7, a magnetic field sensor of this type has a light source 1, a polarizer 2, a Faraday element (magnetic garnet in the form of a thin film) 3 as a magnetooptical element, a polarizer 4 and a photoreceptor element 5, arranged in sequence. They are linked, by optical means for light transmitting such as optical fibres, lenses or the like (not shown). The direction of the axis of easy magnetization of Faraday element 3 is at right angles to the thin film plane, and maze-like magnetic domains are formed in the thin film. This Faraday element 3 has the thin film element disposed at right angles to the direction of the magnetic field to be measured, so that its axis of easy magnetization is parallel to the direction of the magnetic field to be measured (Japanese Patent Disclosure Nos. 58-139082, 58-27071, 58-27072). The light is transmitted at right angles to the thin film plane of Faraday element 3. Polarizers 2 and 4 are arranged so that their axes of polarization make an angle of 45° with respect to each other.

The principle of this optical magnetic field sensor will now be explained. The light radiated from light source 1 first becomes linearly polarized light at polarizer 2, then passes through the Faraday element 3. When the magnetic field applied to Faraday element 3 is 0 (zero), the Faraday element 3 is in a demagnetized state, and since there is no magnetization component in the direction of transmission of the light, the plane of polarization of the light does not rotate. As the axes of polarization between polarizers 2 and 4 are rotated through an angle of 45° with respect to each other, the light from light source 1 is detected by photoreceptor element 5. In this case, the light is reduced only by the amount of attenuation in the members constituting the sensor.

When on the other hand a magnetic field H is applied to Faraday element 3, the magnetic field H induces a magnetization component in Faraday element 3 in the direction of transmission of the light, and the plane of polarization of the linearly polarized light passing through Faraday element 3 is rotated through an angle $\theta$ proportionate to M, namely $$\theta = \theta_F \cdot l \cdot M/M_S$$

(where $\theta_F$ is the coefficient of Faraday rotation, l is the optical path of Faraday element, $M_S$ is the saturation magnetization). Generally speaking, in magnetic garnet, the magnetization component M changes linearly with the magnetic field until a magnetic field is reached equivalent to the demagnetizing field $$H_d = N \cdot 4\pi M_s$$

(where N is the coefficient of demagnetizing field), so the angle of rotation $\theta$ is also proportional to H. The larger this angle of rotation $\theta$ becomes, the greater the change in the intensity P of the light passing through polarizer 4 and detected by the photoreceptor element 5. In the magnetic field sensor described above, therefore, the size of magnetic field H is measured by the change in light intensity P.

However, the arrangement of this kind of magnetic field sensor, in which the direction of the easy axis of magnetization of the magnetic garnet single crystal in the form of a thin film is at right angles to the thin film plane, maze-like magnetic domains are formed in the film plane, the axis of easy magnetization of the magnetic garnet single crystal is parallel to the direction of the magnetic field to be measured, and the magnetic field is measured by the changes in magnetization produced by movements of the walls of the domains, gives rise to the following problems. If the diameter of the beam of light is small, then problems will occur due to the nonuniformity of the pattern width of the magnetic domains, and by the width of these domains. This means that if the magnetic field to be measured changes dynamically, the angle $\theta$ may also change, depending on the shape and direction of the magnetic garnet single crystals, in relation to the same magnetic field being measured. This makes it difficult to measure the magnetic field with a high degree of accuracy. A further problem is that since, if the saturation magnetization is large, the energy of the demagnetizing field is also increased, the saturation magnetization can not, in general, be permitted to be large, with the result that it is difficult to measure a high magnetic field.

Non-magnetic ZnSe can be used in place of magnetic garnet single crystal when measuring a high magnetic field. But there is a problem here too, in that ZnSe has only a small magnetooptic effect and low sensitivity.

In addition to the above mentioned problems that are liable to be caused by the width of the magnetic domains, the conventional optical field sensors have a limitation in measuring magnetic fields, due to limitations with respect to saturation magnetization Ms. This occurs, because the measurement sensitivity S with respect to $M_s$ is expressed in the case of the magnetized direction or the shape of the magnetic garnet single crystals to be used as Faraday elements as;

$$S = \theta_F \cdot l / M_s.$$

OBJECT OF THE INVENTION

It is object of the present invention to provide a magnetic field sensor which can measure a wide range of magnetic fields with a high output power signal and with a high degree of accuracy.

SUMMARY OF THE INVENTION

To accomplish the objects of the present invention, there is provided a light source part, a magnetic field detection part which contains a magnetooptic element consisting of magnetic materials having a magnetooptic effect, and a light measurement part which measures the light that has been radiated from the light source part and which has passed through the magnetic field detection part. This invention is characterized in that the magnetooptic element is arranged such that its axis of easy magnetization is at right angles to the direction of the magnetic field to be measured.

The following may be cited as specific examples of the construction of the magnetic field sensor of the invention: (1) a construction in which the magnetooptic element is in the form of a thin film, with its axis of easy magnetization in the thin film plane, that is, the direction of the easy magnetization axis is parallel to the thin film plane, the thin film plane of the magnetooptic element is at right angles to the direction of the magnetic field to be measured, and the light is transmitted at right angles to the thin film plane, that is, a direction of the incident light beam is at right angles to the thin film plane; (2) a construction in which the magnetooptic element is in the form of a thin film, with its axis of easy magnetization in the thin film plane, the thin film plane of the magnetooptic element is parallel to the direction of the magnetic field to be measured, and the light is transmitted parallel to the thin film plane; (3) a construction in which the magnetooptic element is in the form of a thin film, with its axis of easy magnetization facing in one direction, at right angles to the thin film plane, the thin film plane of the magnetooptic element is parallel to the direction of the magnetic field to be measured, and the light is transmitted at right angles to the thin film plane of the magnetooptic element; or (4) a construction in which the magnetooptic element is in the form of a thin film, with its axis of easy magnetization at right angles to the thin film plane, the thin film plane of the magnetooptic element is parallel to the direction of the magnetic field to be measured, and the light is transmitted parallel to the thin film plane of the magnetooptic element.

The magnetic materials which are used in the above mentioned cases (1), (2), (3) and (4) are preferably a magnetooptic element has uniaxial magnetic anisotropy.

When the axis of easy magnetization of the magnetic materials is in the thin film plane, as in constructions (1) or (2), the anisotropic magnetic field $H_K$ of the magnetic materials constituting the magnetooptic element, at right angles to its thin film planes, and its saturation magnetization $4\pi M_S$ should satisfy the relation $H_K < 4\pi M_S$. When the axis of easy magnetization of the magnetic materials faces in one direction, at right angles to the thin film plane, as in construction (3), the anisotropic magnetic field $H_K$ at right angles to the thin film plane of the magnetic materials, its coercive force $H_C$ and its saturation magnetization $4\pi M_S$ should satisfy the relation $H_K \geq 4\pi M_S$ and $H_C > 4\pi M_S$. When the axis of easy magnetization of the magnetic materials is at right angles to the thin film plane, as in constructin (4), the anisotropic magnetic field $H_K$ at right angles to the thin film plane of the magnetic materials and its saturation magnetization $4\pi M_S$ should satisfy the relation $H_k > 4\pi M_S$.

Magnetic garnet, expressed (for example) by the general formula given below, is used as the magnetic materials. Magnetic materials fulfilling the conditions described above, and thus magnetic field sensors of the constructions (1) to (4) described above, can be obtained by altering its composition as appropriate.

The magnetic garnet used has the composition expressed by the 1st general formula $R_3Fe_5O_{12}$ (where R is at least one element selected from Y, La, Ce, Nd, Pr, Sm, Eu, Gd, Tb, Dy, Ho, Er, Tm, Yb and Lu), the composition expressed by the 2nd general formula $[Bi_xR_{3-x}]Fe_5O_{12}$ (where R is at least one element selected from Y, La, Ce, Nd, Pr, Sm, Eu, Gd, Tb, Dy, Ho, Er, Tm, Yb and Lu, $0.01 \leq x \leq 2.5$), or the composition expressed by the 3rd general formula $[Bi_xR_{3-x}](Fe_{5-y-z}M_yN_z)O_{12}$ (where R is at least one element selected from Y, Ca, Sr, La, Ce, Nd, Pr, Sm, Eu, Gd, Tb, Dy, Ho, Er, Tm, Yb and Lu; M is at least one element selected from Ga, Al, Ge, Si, V and Sb, and N is at least one element selected from Ti, Cr, Mn, Ni, Co, Zr, Hf, Sn, Mg, In, Ta, Nb and Sc, $0.01 \leq x \leq 2.5$, $0.01 \leq y \leq 2.0$, $0.01 \leq z \leq 1.0$).

An explanation follows of the action of the elements constituting the magnetic garnet expressed by these formula, and the reasons for the limits set as to their contents in each case.

Bi(Bismuth) has the action of enhancing the magnetooptic effect and increasing the sensitivity of the magnetic field sensor. The reason why the range of x, which represents the Bi content, is set at $0.01 \leq x \leq 2.5$ is that with x at less than 0.01 there is no observable increase in the magnetooptic effect, while with x at more than 2.5 it is difficult to grow the single crystal, or the yield is inferior, or else more faults occur in the single crystal, making it unsuitable for use.

The M which in the 3rd general formula is substituted for part of the Fe(Iron) is a non-magnetic element which has the action of turning the easy axis of magnetization to the thin film plane by reducing the perpendicular magnetic anisotropism, or of facing it at right angles to the thin film plane by reducing the saturization magnetization. The reason why the range of y, which represents the M content, is set at $0.1 \leq y \leq 2.0$ is that with y at less than 0.01 the effects mentioned were not obtained, while with y at more than 2.0 the magnetooptic effect is reduced.

The N which in the 3rd general formula is similarly substituted for part of the Fe has the action of increasing magnetization in the thin film plane or at right angles to it, and makes it possible to measure higher magnetic fields. The reason why the range of z, which represents the N content, is set at $0.01 \leq z \leq 1.0$ is that with z at less than 0.01 the effects mentioned are not obtained, while with z at more than 1.0 the magnetooptic effect is reduced.

Because it contains Bi, magnetic garnet expressed by the general formulae given above has a very large magnetooptic effect and outstanding magnetic field sensitivity, and thus can measure minute magnetic fields. The M (Ga, Al, Ge, Si, V, Sb) and N (Ti, Cr, Mn, Ni, Co, Zr, Hf, Sn, Mg, In, Ta, Nb, Sc) components enable it, moreover, to measure high magnetic fields. Among the N components, this effect is particularly marked in the case of Co(Cobalt).

By selecting the suitable composition, above mentioned cases of construction (1), (3) and (4) can be measure over a wide range of magnetic field with a high accuracy, and the case of construction (2) can be measuring over a small condition of the magnetic field with a high sensitivity and a high accuracy.

Furthermore, in this invention the magnetic garnet expressed by general formulas $R_3Fe_5O_{12}$, $[Bi_xR_{3-x}]Fe_5O_{12}$ or $[Bi_xR_{3-x}](Fe_{5-y-z}M_yN_z)O_{12}$ can be given an angle of Faraday rotation which is constant over a wide range of temperatures, by adjusting the Gd, Tb and Dy content of R, the M content y and the N content z.

The thickness of the magnetic garnet film used in the invention is determined with reference to transmittivity and the size of the angle of Faraday rotation. When the light is transmitted at right angles to the thin film plane of the magnetic materials, as in magnetic field sensors of constructions (1) or (3), the thickness is usually 1–400 μm, and preferably 4–100 μm; several films may be used, superimposed. When the light is transmitted parallel to the thin film plane of the magnetic materials, as in a magnetic field sensor of construction (2) or (4), the thickness is usually at least 10 μm, and preferably at least 40 μm; several films may be used, arrayed in the direction of transmission of the light. Alternatively, a thin sheet, of a maximum thickness of 5 mm, may be used in place of the thin film. In particular, if several thin films of magnetic garnet are used, of different temperature characteristics and Faraday rotation angle, with their composition adjusted as described above, performance can be obtained which is stable despite changes of temperature, enabling measurement to be made of magnetic fields over a wide range of temperatures.

The magnetic garnet thin film used in the invention can be of any shape (circular, rectangular, etc.), and there is no need to adopt any specific shape. The ratio of thickness t to length (especially minimum length $l_s$) of the thin film or thin sheet is preferably $t/l_s \leq 0.5$.

The magnetic garnet used in the invention can be either single crystal or polycrystalline; but usually single crystal, which absorbs little light, is preferable. Common methods of growing such single crystals include the flux method process, which uses the oxides PbO, $PbF_2$, $Bi_2O_3$, $MoO_3$, $V_2O_5$ etc. as flux, the CVD (Chemical Vapor Deposition) method, the LPE (Liquid Phase Epitaxial) method, the FZ (Floating zone) method, the TSSG (Top Seeded Solution Growth) method and the hydrothermal method.

Anisotropy induced by uniaxial growth (uniaxial magnetic anisotropy) tends to occur in magnetic garnet single crystal grown by the LPE or flux methods, which are those most commonly used at the present time.

When magnetic garnet single crystal grown by the flux method, for example, has uniaxial magnetic anisotropy, it can be used in the magnetic field sensors of constructions (1) and (2), the magnetic garnet thin film is prepared by cutting horizontally to the plane of the film in the direction in which the uniaxial magnetic anisotropy has developed (this is the easy axis of magnetization). Magnetic garnet single crystal can be used in the magnetic field sensors of constructions (3) or (4), if the magnetic garnet thin film is prepared by cutting vertically in the direction in which the uniaxial magnetic anisotropy has developed. If the magnetic garnet thin film is prepared by cutting horizontally or vertically in the direction in which the uniaxial magnetic anisotropy has been developed, the easy axis of magnetization and the direction of measuring magnetic field can provide at a right angle to each other, for the magnetic field sensor of the constructions (1), (2), (3) and (4).

In magnetic garnet single crystal thin film, the easy axis of magnetization, while it also depends on the composition, is in any one of the directions $<111>$, $<110>$ and $<100>$. In the magnetic field sensor of constructions (1), (2), (3) and (4) having such uniaxial magnetic anisotropy, because the change of magnetization occurs by the rotation of magnetic moment, the limit of the magnetic field $H_s$ that can be measured is the sum of the demagnetizing field ($N.4\pi M_s$) and the anisotropic magnetic field $H_K$ ($=2K_U/M_s$). This makes it possible to measure high magnetic fields.

Namely, the uniaxial magnetic anisotropy energy $K_U$ can be maximized at about $10^5$ erg/cm$^3$, by controlling the composition. $M_s$ can be prepared to the range of 0–160 Gauss. $H_s$ becomes to the value of maximum some 10KOe. With these conditions met the measurement of the high magnetic field is possible. Particularly a, large $K_U$ can be obtained in which the composition elements contain Pr, Nd, Sm, Eu, Tb and Bi. A magnetic field sensor of the construction (2), the limit of the magnetic field $H_s$ can be too small in relation to $M_s$, because the effect of demagnetizing is not due to the change of the magnetization lines by magnetic rotations, and the measuring sensitivity S ($S = \theta_F.l/H_s$) becomes too large, because of the measurement of the high sensitivity and high accuracy for small magnetic field becomes possible.

In the LPE method, gadolinium gallium garnet $Gd_3Ga_5O_{12}$ (GGG) which has {111} faces is usually used as the substrate of the construction (3) or (4), and the thin film is formed by epitaxial growth on this substrate of the desired magnetic garnet single crystal. In the case of the substrate of the construction (1) or (2), the easy axis of magnetization can be made to be in the thin film plane if the axis is in the <110> direction. If the axis is in the <111> or <100> direction, it can similarly be made to be in the thin film plane by using {110} face substrate.

When growing magnetic garnet single crystal with e.g. a high Bi content, it is preferable to use a single crystal substrate of $Nd_3Ga_5O_{12}$, $Sm_3Ga_5O_{12}$ or their derivatives, in which there is minimal mismatch of the lattice constants with the magnetic garnet single crystal, in place of the GGG substrate.

With the magnetic field sensor according to the present invention, it is desirable, that the easy axis of magnetization of magnetic garnet and the direction of the magnetic field that is being generated by the current carrying element and which is being measured are aligned at right angles, but if it does not coincide exactly at right angles, an object of the present invention may still be sufficiently achieved by changing the relative sensitivity of measurement, and when increasing the sensitivity of measurement in the construction (2), it is desirable to reduce the uniaxial magnetic anisotropy.

It is further desirable, when necessary to control the magnitude of the uniaxis magnetic absotropy in the constructin (1) and using a specific orientation plane of magnetic garnet crystal, to reduce the uniaxial magnetic anisotropy that is produced at right angles to that plane. With magnetic garnet single crystal which has uniaxial anisotropy at right angles to the thin film plane, this uniaxial magnetic anisotropy can be reduced, and the direction of magnetization made to lie in the thin film plane, by annealing. The temperature of this annealing is preferably 900°-1500° C. This is because if the annealing temperature is lower than 900° C. there is no observable reduction of uniaxial magnetic anisotropy, while if it exceeds 1500° C. the light absorption coefficient increases, with a consequent reduction in the sensitivity of the magnetic field sensor.

With a magnetic field sensor of this kind, since the easy axis of magnetization of the magnetooptic element (Faraday element) is at right angles to the direction of the magnetic field to be measured, the magnetization component in the direction of the magnetic field to be measured is produced by a mechanism of the magnetic rotation magnetic and this magnetization component changes linearly in proportion to the size of the magnetic field to be measured, right up to high magnetic fields. Again, since the effect of non-uniformity of the pattern of the magnetic domains, and of the width of the magnetic domains, can be avoided, not only when the magnetooptic element does not form maze-like magnetic domains, but even when it does form such domains, magnetic fields can be measured with a high degree of accuracy.

BRIEF DESCRIPTION OF THE DRAWINGS

FIG. 3, FIG. 4 and FIG. 5 are block diagrams of a magnetic field sensor according to other embodiments of the invention, respectively.

DETAILED DESCRIPTION OF THE PREFERRED EMBODIMENTS

Figure 1:
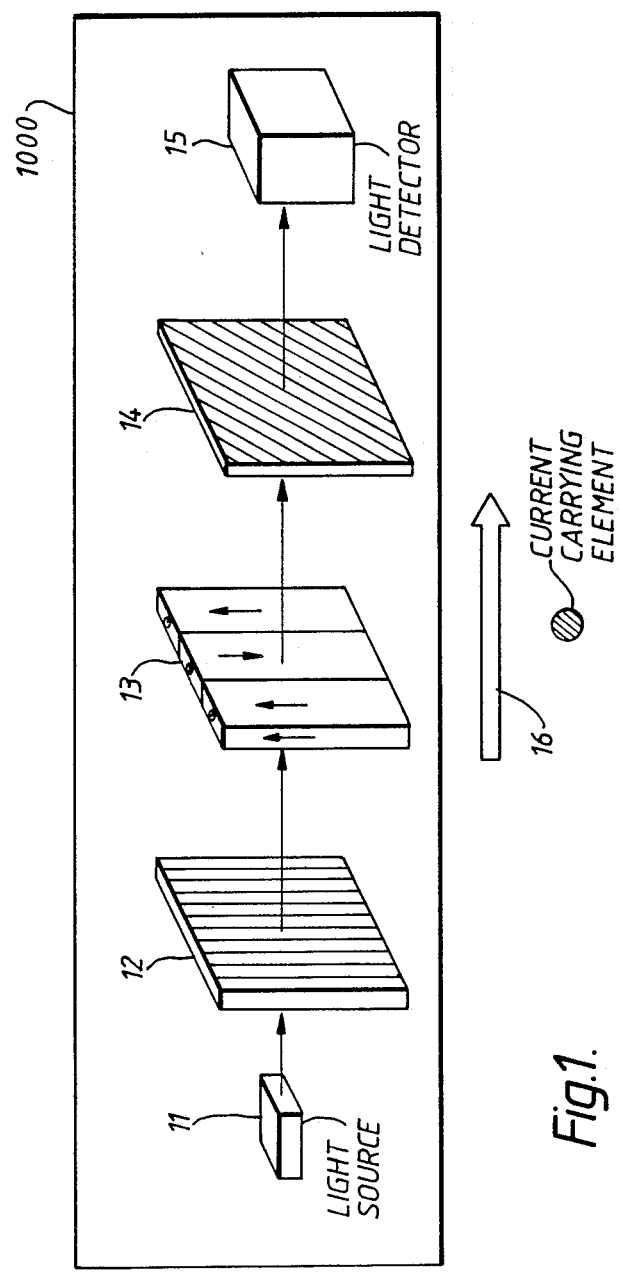
FIG. 1 is a block diagram of an optical magnetic field sensor according to the invention.

Embodiments of the invention are explained below, referring to the drawings.

FIG. 1 is a block diagram of a magnetic field sensor according to one embodiment of the invention. In this drawing, a light source 11, a polarizer 12, a Faraday element 13 in the form of a thin film, a polarizer 14 and a photoreceptor element 15 are arranged in sequence. The field sensor is aligned with a current carrying element as shown in FIG. 1 and the output of the light detector, i.e., the photoreceptor 15 produces a signal which varies as a function of the amount of current in the current carrying element. They are linked, by optical means such as optical fibres, lenses or the like (not shown in the drawing). Item 1000 may be any suitable means for mounting the assembly such that the easy axis of magnetization of the magnetic-optic element is at right angles to the direction of the magnet field being generated by the current carrying element.

In this magnetic field sensor, the easy axis of magnetization of Faraday element 13 is in the thin film plane, and the thin film plane is arranged at right angles to the direction 16 of the magnetic field to be measured. The light is transmitted at right angles to the thin film plane of Faraday element 13.

Figure 2:
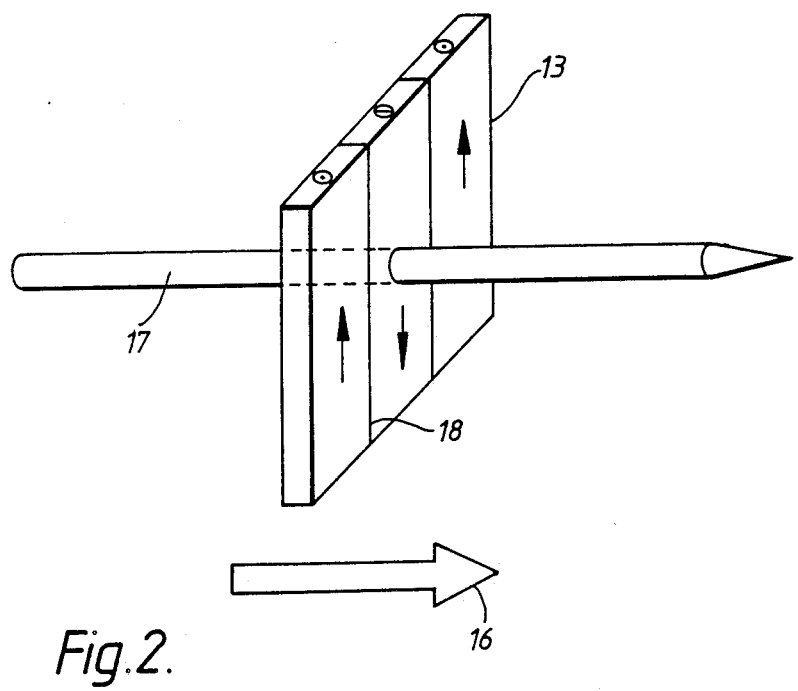
FIG. 2 shows the relation of directions of, the incident light beam which passes through Faraday element, the magntic field to be measured and the easy axis of magnetization.

The arrangement is such that, as shown in FIG. 2, the beam of light 17 which passes through Faraday element 13 does not tranverse the magnetic walls 18 of Faraday element 13. Polarizers 12 and 14 are disposed such that the axis of polarization between them is rotated through an angle of 45°. Signal-processing is carried out to ensure that when the magnetic field to be measured H=0, the output signal P=0.

The principle of this magnetic field sensor will now be explained. First, the light radiated from light source 11 passes via optical fibres (not shown in the drawing) through polarizer 12, becoming linearly polarized light. Next, this linearly polarized light strikes, at right angles, the thin film plane of Faraday element 13. When magnetic field to be measured H is applied to Faraday element 13, magnetization M is produced in the transmission direction of the light, in proportion to the magnetic field, and after the linearly polarized light has passed through Faraday element 13, the angle $\theta$ of inclination of its plane of polarization is rotated in proportion to this magnetization by an amount $\theta = \theta_F \cdot l \cdot M/M_S$ (where $\theta_F$ is the coefficient of Faraday rotation, l is the optical path of Faraday element, $M_S$: saturation magnetization of magnetic garnet). Its plane of polarization having been rotated through the angle $\theta$, the linearly polarized light passes through polarizer 14 and is directed via optical fibres to photoreceptor 15, to obtain output signal P. Thus magnetic field H is measured as output signal P.

FIG. 3 is a block diagram of another embodiment of a magnetic field sensor according to this invention. In this drawing, a light source 21, a polarizer 22, a Faraday element 23 in the form of a thin film, a polarizer 24 and a photoreceptor 25 are arranged in sequence. They are linked, by optical means such as optical fibres, lenses or the like (not shown in the drawing).

In this magnetic field sensor, the thin film plane is parallel to the direction 26 of the magnetic field to be measured, so that the easy axis of magnetization of Faraday element 23 is unidriectional, at right angles to the thin film plane, and at right angles to the direction 26 of the magnetic field to be measured. The light is transmitted at right angles to the thin film plane of Faraday element 23.

Polarizers 22 and 24 are disposed such that the axis of polarization between them is rotated through an angle of 45°. Signal-processing is carried out to ensure that when the magnetic field to be measured H=0, the output signal P=0. Measurement of a magnetic field is effected by the mangetic field sensor shown in FIG. 3 on the same principle as in the case of the magnetic field sensor shown in FIG. 1.

Figure 4:
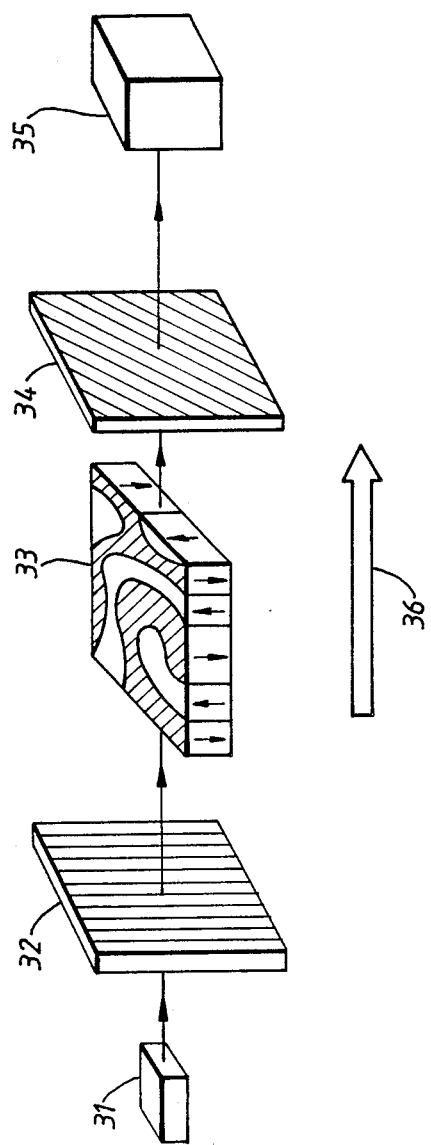

FIG. 4 is a block diagram of another embodiment of a magnetic field sensor according to this invention. In this drawing, a light source 31, a polarizer 32, a Faraday element 33 in the form of a thin film, a polarizer 34 and a photoreceptor 35 are arranged in sequence. They are linked, by optical means such as optical fibers. lenses or the like (not shown in the drawing).

In this magnetic field sensor, the thin film plane is parallel to the direction 36 of the magnetic field to be measured, so that the easy axis of magnetization of Faraday element 33 is at right angles to the thin film plane and to the direction 36 of the magnetic field to be measured. The light is transmitted parallel to the thin film plane of Faraday element 33.

Figure 5:
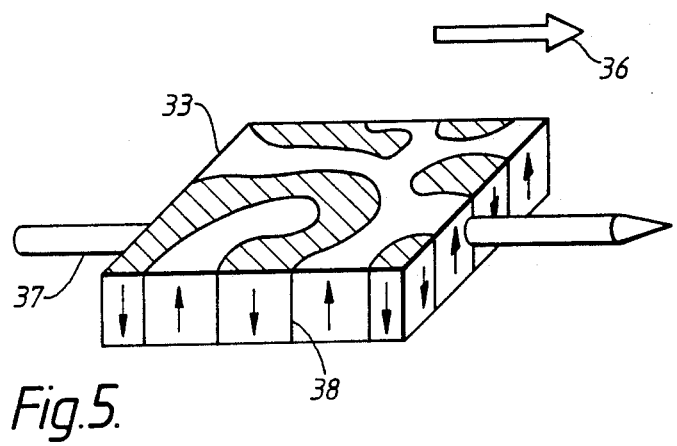

As shown in FIG. 5, the incident light beam 37 which passes through Faraday element 33 can traverse the magnetic walls of Faraday element 33. Polarizers 32 and 34 are disposed such that the axis of polarization between them is rotated through an angle of 45°. Signal-processing is carried out to ensure that when the magnetic field to be measured H=0, the output signal P=0.

Measurement of a magnetic field is effected by the magnetic field sensor shown in FIG. 4 on the same principle as in the case of the magnetic field sensor shown in FIG. 1.

Figure 6:
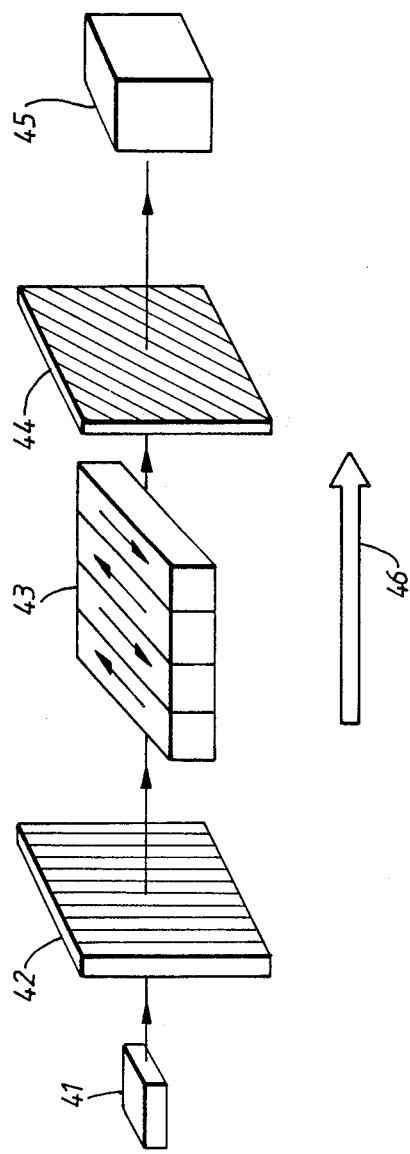
FIG. 6 shows the relation of directions of, the incident light beam which passes through Faraday element, the magnetic field to be measured and the easy axis of magnetization, of another embodiment.

FIG. 6 is a block diagram of another embodiment of a magnetic field sensor according to the invention. In this drawing, a light source 41, a polarizer 42, a Faraday element 43 in the form of a thin film, a polarizer 44 and a photoreceptor 45 are arranged in sequence. They are linked, by optical means such as optical fibers, lenses or the like (not shown in the drawing).

In this magnetic field sensor, the thin film plane is parallel to the direction 46 of the magnetic field to be measured, so that the axis of easy magnetization of Faraday element 43 is in the thin film plane and at right angles to the direction 46 of the magnetic field to be measured. The light is transmitted parallel into the thin film plane of Faraday element 43.

Polarizers 42 and 44 are disposed such that the axis of polarization between them is rotated through an angle of 45°. Single-processing is carried out to ensure that when the magnetic field to be measured H=0, the output signal P=0. Measurement of a magnetic field is effected by the magnetic field sensor shown in FIG. 6 on the same principle as in the case of the magnetic field sensor shown in FIG. 1.

In the magnetic field sensors shown above, the light source used was an LED of wavelength $\lambda = 1.3$ $\mu$m, the polarizers were rutile $TiO_2$ single crystal, and the photoreceptor was a photodiode (p-i-n PD) of InGaAs. The Faraday elements used consisted of the thin films of magnet garnet of Embodiments 1-19 having the composition shown in the Tables 1 and 2 below (Embodiments 1-4 for the magnetic field sensor of FIG. 1, Embodiments 5-9 for the magnetic field sensor of FIG. 3, Embodiments 10-14 for the magnetic field sensor of FIG. 4 and Embodiments 15-19 for the magnetic field sensor of FIG. 6). Changes in output P were investigated by applying magnetic fields to each Faraday element in the prescribed direction.

These magnetic garnet thin films were made by being as follows. The magnetic garnet thin films of constructions of Embodiments 1-4 and 15-19 were grown by LPE method or flux method and cutting to parallel to the direction of the single axis of anisotropic magnetic on a $Gd_3Ga_5O_{12}$, $Nd_3Ga_5O_{12}$ or $(GdCa)_3(MgZrGa)_5O_{12}$ single crystal substrate as it becomes to {110} plane or {111} plane in the thin film plane for the easy magnetized axis of thickness 0.5 mm. The magnetic garnet thin films of constructions of Embodiments 5-14 were grown by LPE method or flux method and cutting at right angle to the direction of the single axis of anisotropic magnetic on a $Gd_3Ga_5O_{12}$, $Nd_3Ga_5O_{12}$ or $(GdCa)_3(MgZrGa)_5O_{12}$ single crystal substrate as it becomes to {111} plane at right angle on the thin film plane for the easy magnetized axis of thickness 0.5 mm.

The thickness of the thin film of magnetic garnet was, for example, 40 $\mu$m–400 $\mu$m in the case of the magnetic garnet thin film of Embodiment 1-9, and 200 $\mu$m–700 $\mu$m in that of the thin film of Embodiment 10-19.

Figure 7:
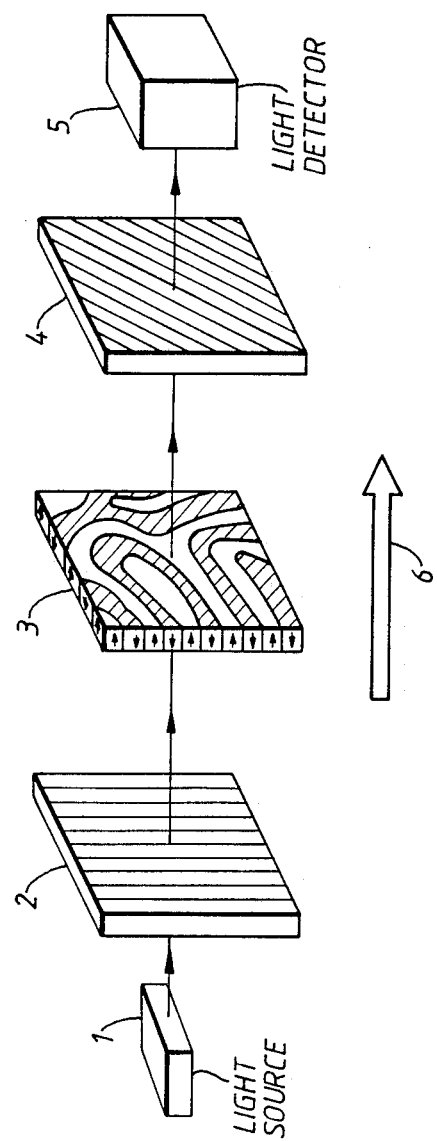
FIG. 7 is a block diagram of the conventional magnetic field sensor.

Conventional magnetic field sensors (FIG. 7), with a Faraday element consisting of non-magnetic ZnSe single crystal (film thickness 5 mm) such as has been mentioned in the published reports (Example 1 for Comparison), and of magnetic garnet thin film of the composition listed in the Table below (Examples 2, 3 and 4 for Comparison) (film thickness 100 $\mu$m, 100 $\mu$m and 500 $\mu$m, respectively), were prepared for comparison with the magnetic field sensors described above, and measurement carried out in the manner described.

The Tables 1 and 2 below summarize the output, resolving power and range of magnetic field measured, of the various magnetic field sensors.

Figure 8:
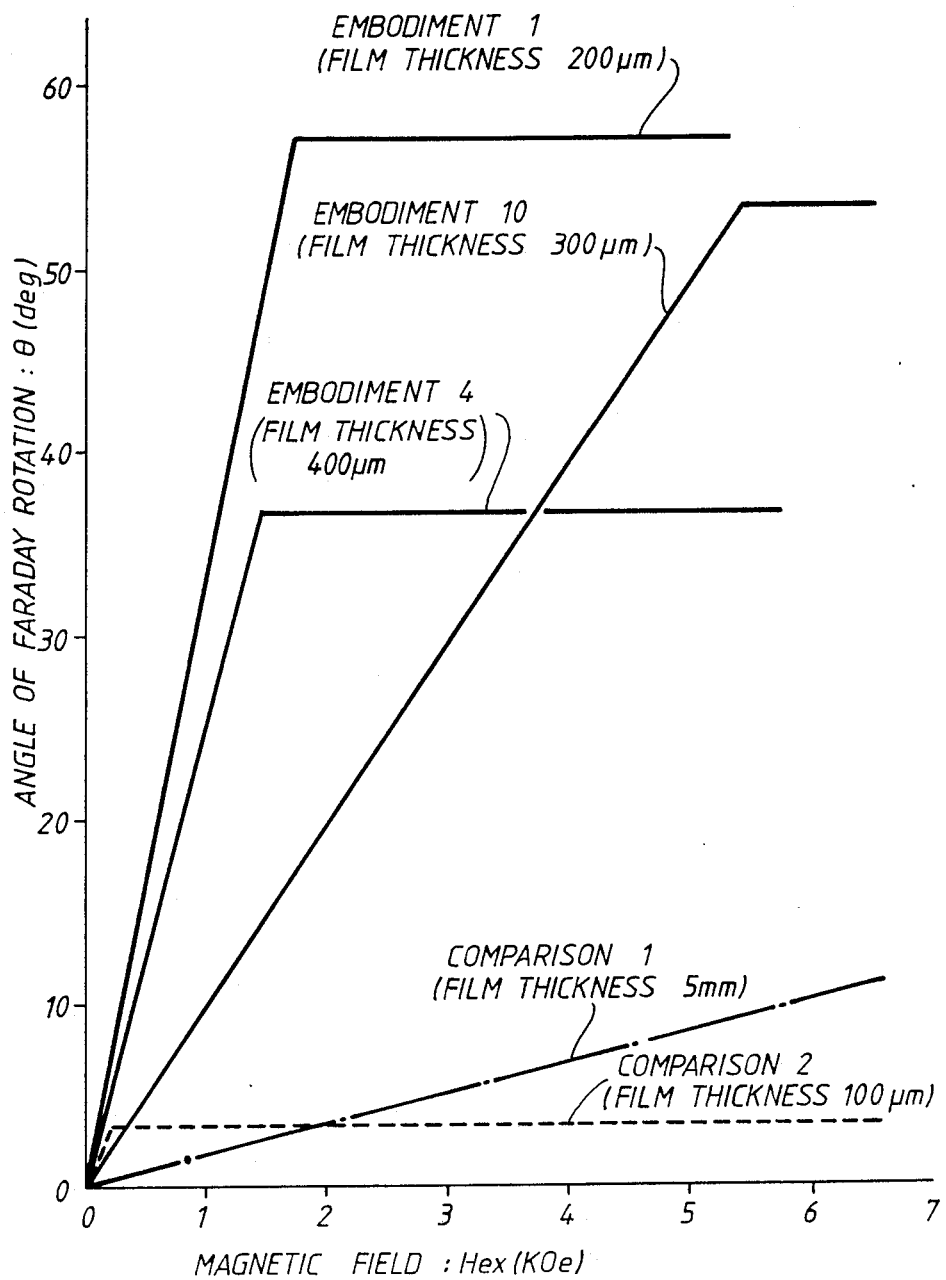
FIG. 8 and FIG. 9 show the characteristics for embodiments and comparisons, respectively.
Figure 9:
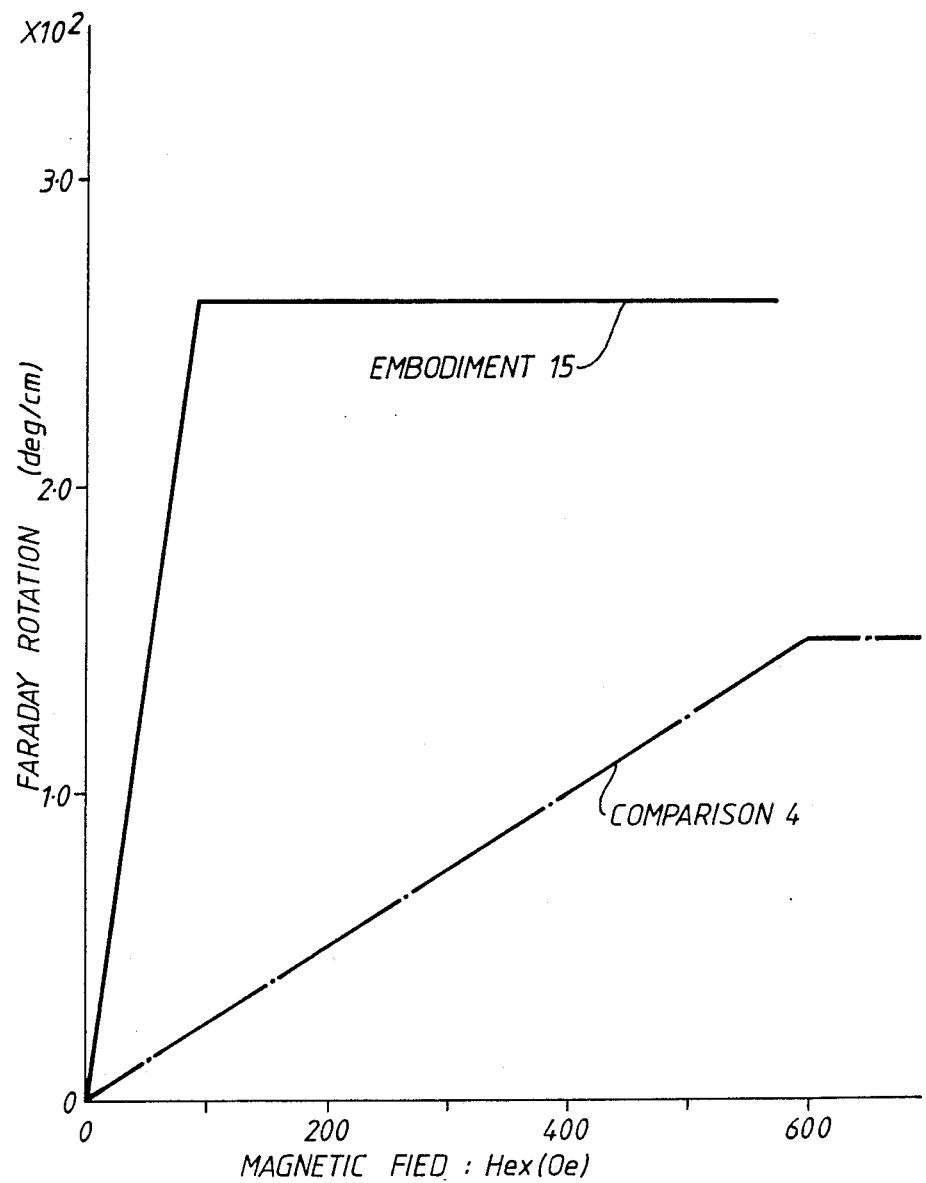

FIG. 8 shows the relation between the applied magnetic field and the angle of Faraday rotation, for Embodiments 1, 4 and 10 and Examples 1 and 2 for Comparison; and FIG. 9, the relation between the magnetic field applied and the angle of Faraday rotation for Embodiment 15 and Example 4 for Comparison.

TABLE 1

| No. | Composition | Output power ($\mu$W/Oe) | Resolution (Oe) | Range of measurement (Oe) |
|---|---|---|---|---|
| | Embodiments | | | |
| 1 | $[Bi_{1.9}Nd_{0.1}Y_{1.0}]Fe_5O_{12}$ | 0.45 | 0.01 | 0.1–1850 |
| 2 | $[Bi_{1.0}Sm_{0.1}Y_{1.9}]Fe_5O_{12}$ | 0.20 | 0.01 | 0.1–1800 |
| 3 | $[Bi_{0.6}Pr_{0.1}Y_{1.4}Gd_{0.9}]$ $(Fe_{4.4}In_{0.1}Ga_{0.5})O_{12}$ | 0.30 | 0.01 | 0.1–1300 |
| 4 | $[Bi_{0.8}Eu_{0.3}Ca_{0.1}Y_{1.0}Tb_{0.8}]$ $(Fe_{4.8}Zr_{0.1}Al_{0.1})O_{12}$ | 0.45 | 0.01 | 0.1–1500 |
| 5 | $[Bi_{0.7}Gd_{0.2}Sm_{1.0}Lu_{0.5}Ca_{0.6}]$ $(Fe_{4.4}Ge_{0.6})O_{12}$ | 0.28 | 0.01 | 0.1–5300 |
| 6 | $[Bi_{0.4}Sm_{2.0}Lu_{0.5}Ca_{0.1}]$ $(Fe_{4.8}Co_{0.1}Al_{0.1})O_{12}$ | 0.20 | 0.01 | 0.1–7200 |

TABLE 1-continued

| No. | Composition | Output power ($\mu$W/Oe) | Resolution (Oe) | Range of measurement (Oe) |
|---|---|---|---|---|
| 7 | $[Bi_{0.8}Gd_{1.7}Sm_{0.5}]$ $(Fe_{4.6}Al_{0.4})O_{12}$ | 0.32 | 0.01 | 0.1–6500 |
| 8 | $[Bi_{0.8}Gd_{2.2}]$ $(Fe_{4.95}Al_{0.05})O_{12}$ | 0.35 | 0.01 | 0.1–2600 |
| 9 | $[Bi_{1.5}Gd_{1.0}Yb_{0.3}Ca_{0.2}]$ $(Fe_{4.5}Co_{0.2}Ga_{0.3})O_{12}$ | 0.54 | 0.01 | 0.1–8600 |
| 10 | $[Sm_{2.2}Lu_{0.5}Bi_{0.3}]Fe_5O_{12}$ | 0.21 | 0.01 | 0.1–5500 |
| 11 | $[Sm_{1.5}Lu_{0.7}Bi_{0.8}]$ $(Fe_{4.4}Ga_{0.6})O_{12}$ | 0.40 | 0.01 | 0.1–8000 |
| 12 | $[Sm_{2.1}Tm_{0.3}Bi_{0.6}]Fe_5O_{12}$ | 0.30 | 0.01 | 0.1–7500 |
| 13 | $[Bi_{1.0}Gd_{2.0}]$ $(Fe_{4.9}Al_{0.1})O_{12}$ | 0.48 | 0.01 | 0.1–3500 |
| 14 | $[Bi_{1.5}Gd_{1.0}Yb_{0.4}Ca_{0.1}]$ $(Fe_{4.6}Co_{0.1}Ga_{0.3})O_{12}$ | 0.62 | 0.01 | 0.1–8200 |
| Example of comparisons | | | | |
| 1 | ZnSe | 0.015 | 1.0 | 100–5000 |
| 2 | $[Y_{1.4}Sm_{0.5}Lu_{0.5}Ca_{0.6}]$ $(Fe_{4.4}Ge_{0.6})O_{12}$ | 0.10 | 0.04 | 0.1–150 |
| 3 | $[Sm_{0.65}Lu_{1.6}Gd_{0.75}]$ $(Fe_{4.82}Al_{0.18})O_{12}$ | 0.10 | 0.04 | 0.1–300 |

TABLE 2

| No. | Composition | measuring sensitivity (deg/Oe · cm) |
|---|---|---|
| Embodiments | | |
| 15 | $[Y_{2.1}Tb_{0.6}Gd_{0.3}]Fe_5O_{12}$ | 2.6 |
| 16 | $[Sm_{1.5}Lu_{0.7}Bi_{0.8}]$ $(Fe_{4.4}Ga_{0.6})O_{12}$ | 30 |
| 17 | $[Bi_{1.0}Gd_{2.0}]$ $(Fe_{4.9}Al_{0.1})O_{12}$ | 22 |
| 18 | $[Bi_{0.4}Gd_{2.0}Tb_{0.5}Ca_{0.1}]$ $(Fe_{4.8}Al_{0.1}Ga_{0.1})O_{12}$ | 45 |
| 19 | $[Bi_{1.6}Sm_{0.5}Lu_{0.5}Ca_{0.4}]$ $(Fe_{4.6}Ge_{0.4})O_{12}$ | 110 |
| Examples of comparison | | sensitivity (deg/Oe · cm) |
| 4 | $[Y_{1.6}Sm_{0.5}Lu_{0.5}Ca_{0.4}]$ $(Fe_{4.6}Ge_{0.4})O_{12}$ | 0.25 |

As is evident from Tables 1 and 2 the magnetic field sensor of the Embodiments 1–14, of the present invention, produces a high output power signal with excellent resolution (i.e. resolving power), and it is clear that the magetic field sensor of Embodiments 1–14 has a wider measuring range of magnetic fields than the magnetic field sensors of Examples 1–3. The magnetic field sensor of Embodiments 15–19 has a higher measuring sensitivity than Examples 1–3.

And more, it is obvious that the Faraday rotation changes linearly until the maximum magnetic field to be measured for the applied magnetic field on the plotted curves for the magnetic field sensor of Embodiments (1), (2), (10) and (15) as shown in FIG. 8 and FIG. 9.

Still more, the same results was obtained by the thin film single crystal (thickness 0.2–1 mm) which is grown with the flux method.

The construction and the magnetic materials of the magnetic field sensor according to the invention can be utilize as a magnetic field sensor used with the optical heterodyne phase detector (Japanese Patent Disclosure Nos. 59-19875, 59-52774), which the magnetic field measurement having the high sensitivity is possible.

Figure 10:
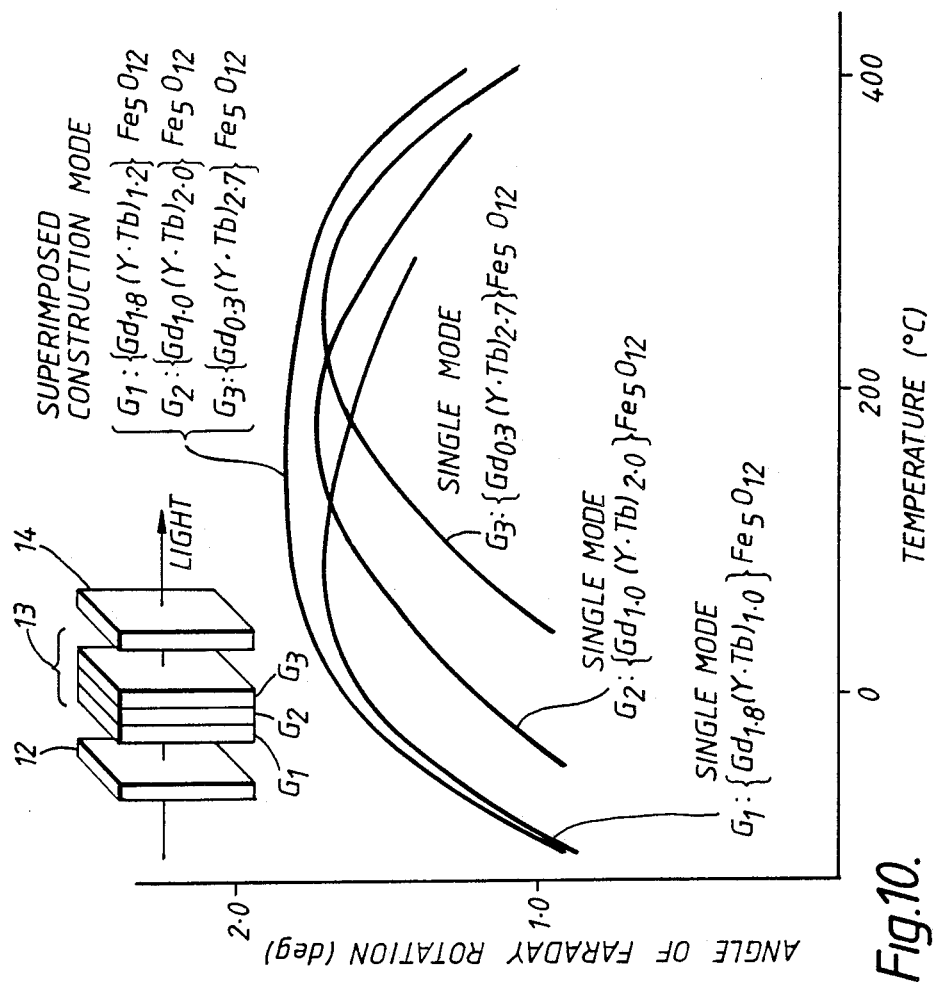
FIG. 10 shows the characteristics for temperature of the superimporsed construction according to the invention.

FIG. 10 shows four curves relation to the angle of Faraday rotaion for the temperature of the magnetooptic element 13.

One curve is appeared the caracteristics indicated as Superimposed Construction Mode which is obtained by the magnetooptic element which is constructed in layers of several thin films of magnetic garnet such as G1: $\{Gd_{1.8}(Y, Tb)_{1.2}\}Fe_5O_{12}$, G2: $\{Gd_{1.0}(Y, Tb)_{2.0}\}Fe_5O_{12}$ and G3: $\{Gd_{0.3}(Y, Tb)_{2.7}\}Fe_5O_{12}$, parformance can be obtained which is stable despite changes of temperature, enabling measurement to be made of magnetic fields over a wide range of temperature. And other three curves are indicated with characteristics according to each magnetic garnet of different types as G1, G2 and G3.

What is claimed is:

1. A magnetic field sensor for measuring the current flowing in a current conducting element comprising:
   a light source;
   a light detector;
   a magneto-optic element which has easy axis of magnetization and which is disposed between said light source and said light detector,
   means for positioning said magneto-optic element with respect to said current carrying element such that the easy axis of magnetization of said magneto-optic element is at substantially right angles to the direction of the magnetic field generated by current flowing in said current conducting element;
   first polarizing elements interposed between said light source and said magneto-optic element;
   second polarizing element interposed between said magneto-optic element and said light detection; and
   wherein said light detector produces a signal based upon a light from said light source which has passed through said polarizing elements and said magneto-optic element which is a function of the magnetic field produced by the current flowing in said current conducting element.

2. A magnetic field sensor of claim 1, wherein said magnetooptic element comprises:
   a thin film; and the easy axis of magnetization of said element is in a thin film plane, said thin film plane of the magnetooptic element is arranged at substantially right angles to a direction of the magnetic field to be measured, and the light is transmitted at substantially right angles to the thin film of the magnetooptic element.

3. A magnetic field sensor of claim 1, wherein said magnetooptic element comprises:
   a thin film; and the easy axis of magnetization of said element is in said thin film plane, said thin film plane of the magnetooptic element is arranged substantially parallel to a direction of the magnetic field to be measured, and the light is transmitted substantially parallel to said thin film of the magnetooptic element.

4. A magnetic field sensor of claim 1, wherein said magnetooptic element comprises a thin film and said elements easy axis of magnetization lies in a direction at substantially right angles to said thin film plane, said thin film plane of the magnetooptic element is substantially parallel to a direction of the magnetic field to be measured, and the light is transmitted at substantially right angles to the thin film plane of the magnetooptic element.

5. A magnetic field sensor of claim 1, wherein said magnetooptic element comprises a thin film and a direction of said elements easy axis of magnetization is at substantially right angles to said thin film plane, said thin film plane of the magnetooptic element is substantially parallel to a direction of said magnetic field to be measured, and the light is transmitted substantially parallel to the thin film plane of the magnetooptic element.

6. A magnetic field sensor of claim 1, wherein said magnetooptic element comprises a thin film and said elements easy axis of magnetization is in a thin film plane, said thin film plane of the magnetooptic element is arranged at substantially right angles to a direction of the magnetic field to be measured, and the light is transmitted at substantially right angles to the thin film of the magnetooptic element, and an anisotropic magnetic field $H_K$ of the magnetic materials constituting the magnetooptic element, at substantially right angles to its thin film plane, and its saturation magnetization $4\pi M_S$, satisfies the relationship:

$$H_k < 4\pi M_S.$$

7. A magnetic field sensor of claim 6, wherein the magnetic materials is magnetic garnet having a composition expressed by the general formula;

$$R_3Fe_5O_{12}$$

(where R is at least one element selected from Y, La, Ca, Nd, Pr, Sm, Eu, Gd, Tb, Dy, Ho, Er, Tm, Yb and Lu).

8. A magnetic field sensor of claim 6, wherein the magnetic materials is magnetic garnet having a composition expressed by the general formula;

$$[Bi_xR_{3-x}]Fe_5O_{12}$$

(where R is at least one element selected from Y, La, Ca, Nd, Pr, Sm, Eu, Gd, Tb, Dy, Ho, Er, Tm, Yb and Lu, $0.01 \leq x \leq 2.5$).

9. A magnetic field sensor of claim 6, wherein the magnetic materials is magnetic garnet having a composition expressed by the general formula;

$$[Bi_xR_{3-x}](Fe_{5-y-z}M_yN_z)O_{12}$$

(where R is at least one element selected from Y, Ca, Sr, La, Ce, Nd, Pr, Sm, Eu, Gd, Tb, Dy, Ho, Er, Tm, Yb and Lu, M is at least one element selected from Ga, Al, Ge, Si, V and Sb, and N is at least one element selected from Ti, Cr, Mn, Ni, Co, Zr, Hf, Sn, Mg, In, Ta, Nb and Sc, $0.01 \leq x \leq 2.5$, $0.01 \leq y \leq 2.0$, $0.01 \leq z \leq 1.0$).

10. A magnetic field sensor of claim 1, wherein said magnetooptic element comprises: a thin film and said elements easy axis of magnetization is in said thin film plane, said thin film plane of the magnetooptic element is arranged substantially parallel to a direction of the magnetic field to be measured, and the light is transmitted substantially parallel to said thin film of the magnetooptic element, and a anisotropic magnetic field $H_K$ of the magnetic materials constituting the magnetooptic element, at substantially right angles to its thin film plane, and its saturation magnetization $4\pi M_S$, satisfies the relationship:

$$H_k < 4\pi M_S.$$

11. A magnetic field sensor of claim 10, wherein the magnetic materials is magnetic garnet having a composition expressed by the general formula;

$$R_3Fe_5O_{12}$$

(where R is at least one element selected from Y, La, Ca, Nd, Pr, Sm, Eu, Gd, Tb, Dy, Ho, Er, Tm, Yb and Lu).

12. A magnetic field sensor of claim 10, wherein the magnetic materials is magnetic garnet have a composition expressed by the general formula;

$$[Bi_xR_{3-x}]Fe_5O_{12}$$

(where R is at least one element selected from Y, La, Ca, Nd, Pr, Sm, Eu, Gd, Tb, Dy, Ho, Er, Tm, Yb and Lu, $0.01 \leq x \leq 2.5$).

13. A magnetic field sensor of claim 10, wherein the magnetic materials is magnetic garnet having a composition expressed by the general formula;

$$[Bi_xR_{3-x}](Fe_{5-y-z}M_yN_z)O_{12}$$

(where R is at least one element selected from Y, Ca, Sr, La, Ce, Nd, Pr, Sm, Eu, Gd, Tb, Dy, Ho, Er, Tm, Yb and Lu, M is at least one element selected from Ga, Al, Ge, Si, V and Sb, and N is at least one element selected from Ti, Cr, Mn, Ni, Co, Zr, Hf, Sn, Mg, In, Ta, Nb and Sc, $0.01 \leq x \leq 2.5$, $0.01 \leq y \leq 2.0$, $0.01 \leq z \leq 1.0$).

14. A magnetic field sensor of claim 1, wherein said magnetooptic element comprises a film and said elements easy axis of magnetization lies in a direction at substantially right angles to a thin film plane, said thin film plane of the magnetooptic element is substantially parallel to a direction of the magnetic field to be measured, and the light is transmitted at substantially right angles to the thin film plane of the magnetooptic element, and anisotropic magnetic field $H_K$ of a magnetic materials constituting the magnetooptic element, at substantially right angles to its thin film plane, its coercive force $H_C$ and its saturation magnetization $M_S$ satisfies the relations;

$$H_k \geq 4\pi M_S \text{ and } H_C > 4\pi M_S.$$

15. A magnetic field sensor of claim 14, wherein the magnetic materials is magnetic garnet having a composition expressed by the general formula;

$$R_3Fe_5O_{12}$$

(where R is at least one element selected from Y, La, Ca, Nd, Pr, Sm, Eu, Gd, Tb, Dy, Ho, Er, Tm, Yb and Lu).

16. A magnetic field sensor of claim 14, wherein the magnetic materials is magnetic garnet having a composition expressed by the general formula;

$$[Bi_xR_{3-x}]Fe_5O_{12}$$

where R is at least one element selected from Y, La, Ca, Nd, Pr, Sm, Eu, Gd, Tb, Dy, Ho, Er, Tm, Yb and Lu, $0.01 \leq x \leq 2.5$).

17. A magnetic field sensor of claim 14, wherein the magnetic materials is magnetic garnet having a composition expressed by the general formula;

$$[Bi_xR_{3-x}](Fe_{5-y-z}M_yN_z)O_{12}$$

(where R is at least one element selected from Y, Ca, Sr, La, Ce, Nd, Pr, Sm, Eu, Gd, Tb, Dy, Ho, Er, Tm, Yb and Lu, M is at least one element selected from Ga, Al, Ge, Si, V and Sb, and N is at least one element selected from Ti, Cr, Mn, Ni, Co, Zr, Hf, Sn, Mg, In, Ta, Nb and Sc, $0.01 \leq x \leq 2.5$, $0.01 \leq y \leq 2.0$, $0.01 \leq z \leq 1.0$).

18. The nagnetic field sensor of claim 1, wherein said magnetooptic element comprises:
a thin film and a direction of said elements easy axis of magnetization is at substantially right angles to said thin film plane, said thin film plane of the magnetooptic element is substantially parallel to a direction of said magnetic field to be measured, and the light is transmitted substantially parallel to the thin film plane of the magnetooptic element, and a anisotropic magnetic field $H_K$ of a magnetic materials constituting the magnetooptic element, at substantially right angles to its thin film plane, and its saturation magnetization $4\pi M_S$ satisfies the relation:

$$H_K > 4\pi M_s.$$

19. A magnetic field sensor of claim 18, wherein the magnetic materials is magnetic garnet having a composition expressed by the general formula;

$$R_3Fe_5O_{12}$$

(where R is at least one element selected from Y, La, Ca, Nd, Pr, Sm, Eu, Gd, Tb, Dy, Ho, Er, Tm, Yb and Lu).

20. A magnetic field sensor of claim 18, wherein the magnetic materials is magnetic garnet having a composition expressed by the general formula;

$$[Bi_xR_{3-x}]Fe_5O_{12}$$

(where R is at least one element selected from Y, La, Ca, Nd, Pr, Sm, Eu, Gd, Tb, Dy, Ho, Er, Tm, Yb and Lu, $0.01 \leq x \leq 2.5$).

21. A magnetic field sensor of claim 18, wherein the magnetic materials is magnetic garnet having a composition expressed by the general formula;

$$[Bi_xR_{3-x}](Fe_{5-y-z}M_yN_z)O_{12}$$

(where R is at least one element selected from Y, Ca, Sr, La, Ce, Nd, Pr, Sm, Eu, Gd, Tb, Dy, Ho, Er, Tm, Yb and Lu, M is at least one element selected from Ga, Al, Ge, Si, V and Sb, and N is at least one element selected from Ti, Cr, Mn, Ni, Co, Zr, Hf, Sn, Mg, In, Ta, Nb and Sc, $0.01 \leq x \leq 2.5$, $0.01 \leq y \leq 2.0$, $0.01 \leq z \leq 1.0$).

22. A magnetic field sensor of claim 1, wherein said magnetic materials comprises:
a plurality of magnetic garnet thin films each having different Faraday angles of rotation temperature characteristics.

23. A magnetic field sensor of claim 1, wherein said magnetooptic element comprises:
a magnetic materials having a form of thin film which has a thickness $\tau$ of said magnetic materials and its minimum length $l_s$ satisfies the relation $\tau/l_s \leq 0.5$.

24. A magnetic field sensor of claim 1, wherein said magnetooptic element comprises a magnetic materials having an uniaxial magnetic anisotropy and said magnetic materials has been annealed at about 900° C. to about 1500° C.

* * * * *